United States Patent
Sakai et al.

(10) Patent No.: US 7,797,822 B2
(45) Date of Patent: Sep. 21, 2010

(54) ELECTRONIC COMPONENT MOUNTING METHOD

(75) Inventors: Tadahiko Sakai, Fukuoka (JP); Hideki Eifuku, Fukuoka (JP); Teruaki Nishinaka, Saga (JP)

(73) Assignee: Panasonic Corporation, Osaka (JP)

( * ) Notice: Subject to any disclaimer, the term of this patent is extended or adjusted under 35 U.S.C. 154(b) by 195 days.

(21) Appl. No.: 11/916,905

(22) PCT Filed: Jun. 16, 2006

(86) PCT No.: PCT/JP2006/312562

§ 371 (c)(1),
(2), (4) Date: Dec. 7, 2007

(87) PCT Pub. No.: WO2006/137504

PCT Pub. Date: Dec. 28, 2006

(65) Prior Publication Data

US 2009/0126188 A1    May 21, 2009

(30) Foreign Application Priority Data

Jun. 20, 2005    (JP) .............................. 2005-178788

(51) Int. Cl.
*H01R 43/00*    (2006.01)
(52) U.S. Cl. .............................. 29/832; 29/834; 29/841; 29/743; 29/740; 29/739
(58) Field of Classification Search ........... 29/832–834, 29/840–842, 739–743; 228/180.21, 180.22, 228/254, 179.1
See application file for complete search history.

(56) References Cited

U.S. PATENT DOCUMENTS

| 5,867,260 | A | * | 2/1999 | Sakai | ......................... | 228/41 |
| 6,065,201 | A | * | 5/2000 | Sakai | ......................... | 29/430 |
| 6,302,313 | B1 | | 10/2001 | Tanaka | | |
| 6,467,158 | B1 | * | 10/2002 | Kiyomura et al. | ............. | 29/740 |

(Continued)

FOREIGN PATENT DOCUMENTS

JP    09-161935    6/1997

(Continued)

OTHER PUBLICATIONS

International Search Report issued Oct. 16, 2006 in the International (PCT) Application of which the present application is the U.S. National Stage.

(Continued)

*Primary Examiner*—Minh Trinh
(74) *Attorney, Agent, or Firm*—Wenderoth, Lind & Ponack, L.L.P.

(57) ABSTRACT

An electronic component mounting method of thermo-compressing and mounting electronic components onto a plurality of unit boards segmented in a multi-piece board which avoids the occurrence of adverse thermal influences on the thermosetting bonding material which is placed on the unit boards before mounting the electronic components. The thermo-compression tool used in the method is removably fitted on a thermo-compression head in an electronic component mounting apparatus; the thermo-compression tool includes a base member and a suck-up member which is smaller than a lower surface of the base member and which is fixed on the lower surface of the base member at a position displaced from a center thereof.

2 Claims, 12 Drawing Sheets

U.S. PATENT DOCUMENTS

| | | | |
|---|---|---|---|
| 6,536,105 B1 * | 3/2003 | Sakai et al. | 29/843 |
| 6,839,959 B1 * | 1/2005 | Hosotani et al. | 29/740 |
| 7,409,761 B2 * | 8/2008 | Haji et al. | 29/832 |

FOREIGN PATENT DOCUMENTS

| | | |
|---|---|---|
| JP | 2000-013005 | 1/2000 |
| JP | 2000-294602 | 10/2000 |
| JP | 2002-064264 | 2/2002 |

OTHER PUBLICATIONS

PCT Written Opinion of the International Searching Authority (in English language) issued Oct. 16, 2006.

Patent Cooperation Treaty (PCT) International Preliminary Report on Patentability, issued Dec. 24, 2007 in International Application No. PCT/JP2006/312562.

* cited by examiner

ELECTRONIC COMPONENT MOUNTING METHOD

TECHNICAL FIELD

The present invention relates to an electronic component thermo-compression tool for sucking an electronic component such as flip chips and thermo-compressing the electronic component onto a board, particularly onto a multi-piece board segmented into a plurality of unit boards, and also relates to electronic component mounting apparatus and mounting method for thermo-compressing and mounting the electronic component sucked by the thermo-compression tool onto the board.

BACKGROUND ART

As an apparatus for bonding and mounting an electronic component, which has a junction bump formed thereon, such as flip chips onto a board, there have been widely used electronic component mounting apparatuses for bonding together and mounting the two members, electronic component and board, by thermo-compression. In this type of electronic component mounting apparatus, an electronic component sucked to the thermo-compression tool is heated while being pressed against the board on which a thermosetting bonding material, such as thermosetting resin or anisotropic conductive material, has previously been fed and placed, by which the thermosetting bonding material is thermally hardened and thus the two members are bonded together (see, Japanese unexamined patent publication No. 2000-13005 A).

Also, for this type of electronic component mounting apparatus, multi-piece boards are widely used as the board onto which electronic components are to be mounted. The multi-piece board is a set of a plurality of unit boards, and after the mounting of electronic components onto the unit boards, is subjected to cutting between individual unit boards so as to be divided into a plurality of independent unit boards.

FIGS. 11A and 11B show a state in which electronic components are being mounted onto a multi-piece board by a conventional thermo-compression tool. Referring to FIG. 11A, a thermo-compression tool 101 is set on a bottom face of a thermo-compression head 100. The thermo-compression tool 101, which is made from heat-resistant material such as ceramics, is constructed such that an electronic-component suck-up member 101b is protrusively provided at a center of a lower surface of a plate-shaped base member 101a.

A first suction hole 102 is formed at a center of the bottom face of the thermo-compression head 100, and a suck-up hole 103 communicating with the suction hole 102 is formed in the thermo-compression tool 101. Further, a second suction hole 104 is formed on either side of the suction hole 102, serving for removably sucking up and holding the thermo-compression tool 101. The thermo-compression head 100 has a heater (not shown) contained therein, serving for heating the thermo-compression tool 101 by its heat conduction.

Such an electronic component mounting apparatus as shown above is so constructed as to allow a plurality of types of thermo-compression tools to be interchanged as required depending on the form of the electronic component to be mounted. Suck-up members 101b of the individual thermo-compression tools are formed in correspondence to the size and other forms of the individual electronic components, respectively, while bases 101a of the individual thermo-compression tools are formed all in common regardless of the form of the suck-up member 101b in order to ensure the interchangeability in their fitting to the bottom face of the thermo-compression head 100.

Referring to FIG. 11B, a multi-piece board 110 is segmented into a plurality of unit boards 110a, 110b, 110c, and so on. A plurality of electrodes 111 are formed on top of each unit board 110a, 110b, 110c . . . , and a thermosetting bonding material 112 is previously placed on each electrode 111 in a preceding process. Bumps P' of electronic components P are mounted on the electrodes 111 and thermo-compressed, where the thermosetting bonding material 112 thermally hardens so that the electronic components P are mounted. When the electronic components P have been mounted onto all the unit boards 110a, 110b, 110c, etc., the multi-piece board 110 is cut and divided on broken lines N.

BRIEF SUMMARY OF THE INVENTION

In recent years, along with the trend toward smaller size and smaller weight of electronic equipment, boards to be mounted thereon have also been getting smaller in size. Accordingly, unit boards segmented in the multi-piece board have also been getting smaller in size so that the pitch of adjoining unit boards has become narrower. Because of this, as shown in FIGS. 11A and 11B, when an electronic component P is thermo-compressed to a unit board 110e located at a center of the multi-piece board 110, the thermo-compression tool 101 approaches also to top faces of unit boards 110f to 110i which have no electronic components mounted thereon and which are adjacent to the unit board 110e, which is the target of mounting. Since the thermo-compression tool 101 is heated, radiant heat H acts to heat the thermosetting bonding material 112 on the before-mounting unit boards 110f to 110i so that the thermosetting bonding material 112 goes on hardening process in the stage before mounting so as to undergo thermal adverse influences such as deterioration. This has been a cause of troubles, for example, that a desired bonding power cannot be exerted in the mounting of the electronic component P.

Accordingly, an object of the present invention, for solving the above-described problems, is to provide an electronic component thermo-compression tool, as well as electronic component mounting apparatus and mounting method, which makes it possible, in thermo-compression and mounting of electronic components onto a plurality of unit boards segmented in a multi-piece board, to avoid thermal adverse influences of the radiant heat of the thermo-compression tool on the thermosetting bonding material placed on the before-mounting unit boards.

In order to achieve the above object, the present invention has the following constitutions.

According to a first aspect of the present invention, there is provided an electronic component thermo-compression tool for thermo-compressing an electronic component via a thermosetting bonding material while sucking up and holding the electronic component thereby mounting the electronic component onto a board, the tool comprising:

a base member which is removably fitted on a head-bottom face of a thermo-compression head in an electronic component mounting apparatus and in which heating by heat transfer for thermo-compression is performed through the head-bottom face of the thermo-compression head; and a suck-up member having a suck-up surface which is formed so as to be smaller than a lower surface of the base member in correspondence to a size of the electronic component and by which the electronic component is sucked up and held, the suck-up member being fixed on the lower surface of the base member at a position displaced from a center of the lower surface, wherein in the suck-up surface of the suck-up member, a suck-up hole is formed at a position displaced from the center of the lower surface of the base member, and the suck-up hole is communicated with a head-side suction hole formed in the head-bottom face of the thermo-compression head in a state that the fitting surface of the base member is fitted to the head-bottom face of the thermo-compression head.

According to a second aspect of the present invention, there is provided the electronic component thermo-compression tool as defined in the first aspect, wherein the suck-up hole is formed so as to extend through the fitting surface of the base member and the suck-up surface of the suck-up member, the base member has a communicating groove portion which is formed in the fitting surface thereof so as to be communicated with the suck-up hole and to confront the head-side suction hole of the thermo-compression head, and a suction passage portion comprises the suck-up hole and the communicating groove portion in a state that the base member is fitted to the head-bottom face.

According to a third aspect of the present invention, there is provided the electronic component thermo-compression tool as defined in the first or second aspects, wherein the base member is a generally rectangular-shaped plate member and the suck-up member is fixed at near a corner portion in the lower surface of the base member.

According to a fourth aspect of the present invention, there is provided an electronic component mounting apparatus for mounting an electronic component onto each of unit boards in a multi-piece board, which is segmented into a plurality of the unit boards, by thermo-compressing the electronic component via a thermosetting bonding material while sucking up and holding the electronic component, the apparatus comprising:

a thermo-compression head which is moved up and down relative to the multi-piece board;

a positioning device for performing a relative positioning of each of the unit boards of the multi-piece board and the thermo-compression head; and a thermo-compression tool which is removably fitted to the thermo-compression head, wherein the thermo-compression tool comprises:

a base member which is removably fitted to a head-bottom face of the thermo-compression head and in which heating by heat transfer for thermo-compression is performed through the head-bottom face of the thermo-compression head; and a suck-up member having a suck-up surface which is formed so as to be smaller than a lower surface of the base member in correspondence to a size of the electronic component and by which the electronic component is sucked up and held, the suck-up member being fixed on the lower surface of the base member at a position displaced from a center of the lower surface, wherein in the suck-up surface of the suck-up member, a suck-up hole is formed at a position displaced from the center of the lower surface of the base member, and the suck-up hole is communicated with a head-side suction hole formed in the head-bottom face of the thermo-compression head in a state that the fitting surface of the base member is fitted to the head-bottom face of the thermo-compression head.

According to a fifth aspect of the present invention, there is provided the electronic component mounting apparatus as defined in the fourth aspect, wherein in the thermo-compression tool, the suck-up hole is formed so as to extend through the fitting surface of the base member and the suck-up surface of the suck-up member, the base member has a communicating groove portion which is formed in the fitting surface thereof so as to be communicated with the suck-up hole and to confront the head-side suction hole of the thermo-compression head, and a suction passage portion comprises the suck-up hole and the communicating groove portion in a state that the base member is fitted to the head-bottom face.

According to a sixth aspect of the present invention, there is provided the electronic component mounting apparatus as defined in the fourth or fifth aspects, wherein in the thermo-compression tool, the base member is a generally rectangular-shaped plate member and the suck-up member is fixed at near a corner portion in the lower surface of the base member.

According to a seventh aspect of the present invention, there is provided an electronic component mounting method for mounting an electronic component onto each of unit boards in a multi-piece board, which is segmented into a plurality of the unit boards, by thermo-compressing the electronic component via a previously fed and placed thermosetting bonding material while sucking up and holding the electronic component, the method comprising:

sucking up and holding the electronic component to a suck-up member of a thermo-compression tool, where the thermo-compression tool includes a base member which is removably fitted on a head-bottom face of a thermo-compression head in an electronic component mounting apparatus and in which heating by heat transfer for thermo-compression is performed through the head-bottom face of the thermo-compression head, and the suck-up member having a suck-up surface which is formed so as to be smaller than a lower surface of the base member in correspondence to a size of the electronic component and by which the electronic component is sucked up and held, the suck-up member being fixed on the lower surface of the base member at a position displaced from a center of the lower surface;

performing a positioning of the sucked-up-and-held electronic component and a first unit board out of first, second and third unit boards, which are mutually adjacently arrayed in one line, so that the base member is not positioned above the second and third unit boards but positioned above the first unit board;

thereafter, moving down the thermo-compression tool and then thermo-compressing the electronic component via the thermosetting bonding material, by which the electronic component is mounted onto the first unit board;

sucking up and holding another electronic component to the suck-up member of the thermo-compression tool; and thereafter, performing a positioning of the electronic component and the second unit board out of the unit boards so that the base member is not positioned above the third unit board but positioned above the first and second unit boards.

According to an eighth aspect of the present invention, there is provided the electronic component mounting method as defined in the seventh aspect, wherein the mounting of the electronic component onto each of the unit boards is performed by the thermo-compression tool, in which the base member is a generally rectangular-shaped plate member and the suck-up member is fixed at near a corner portion in the lower surface of the base member.

According to the present invention, an electronic component suck-up member is protrusively provided at a location displaced from the center of the thermo-compression tool so that in successive mounting of electronic components by thermo-compression onto a plurality of unit boards segmented in the multi-piece board, the thermo-compression tool is kept from approaching above the thermosetting bonding material placed on the before-mounting unit boards. Thus, thermal adverse influences of the radiant heat of the thermo-compression tool on the thermosetting bonding material can be avoided.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
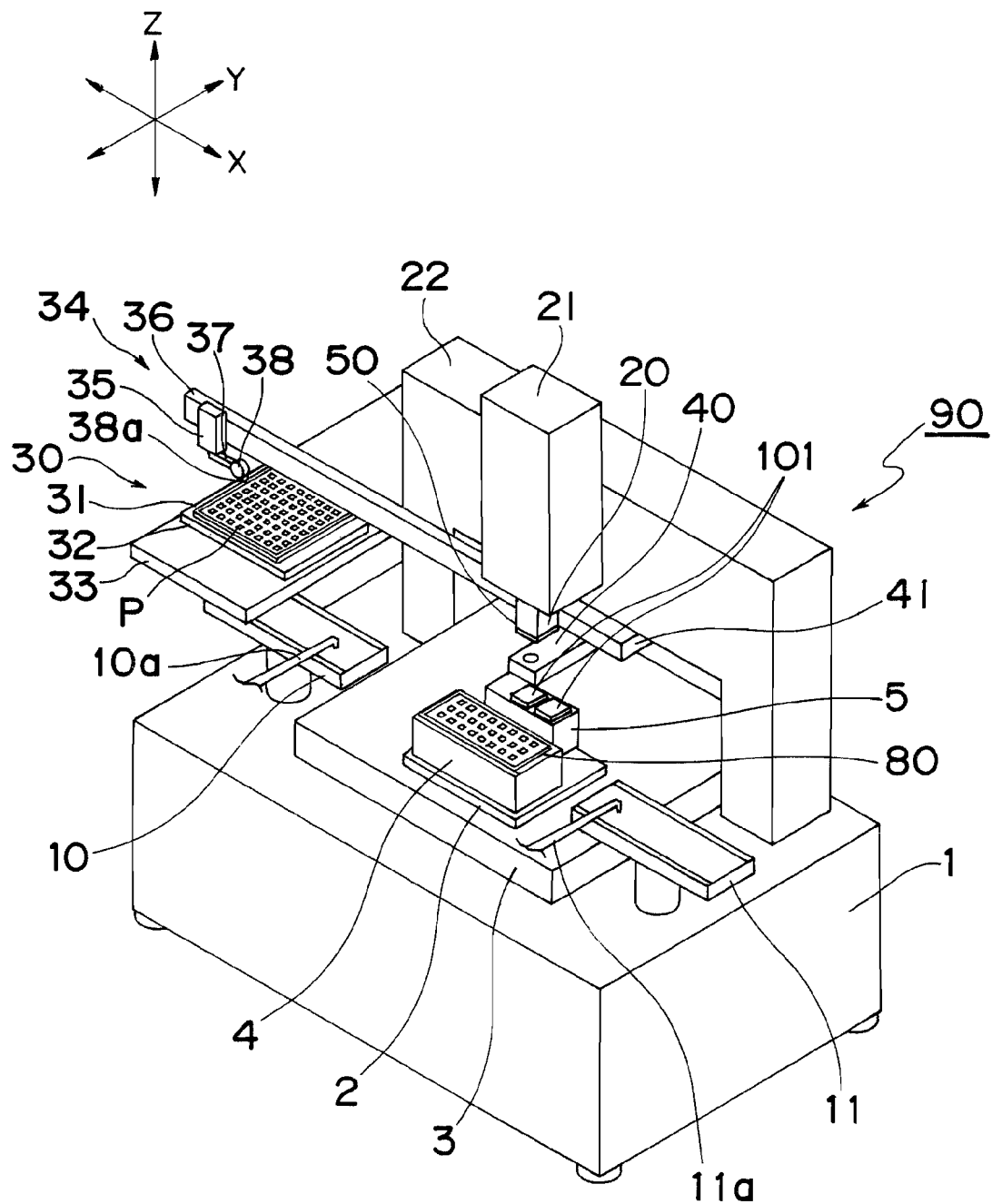
FIG. 1 is a schematic perspective view of an electronic component mounting apparatus in an embodiment of the present invention.

Before the description of the present invention proceeds, it is to be noted that like parts are designated by like reference numerals throughout the accompanying drawings.

Hereinbelow, one embodiment of the present invention is described in detail with reference to the accompanying drawings.

First, overall construction of an electronic component mounting apparatus 90 according to this embodiment of the invention is explained with reference to FIG. 1, which shows a perspective view of the apparatus. Referring to FIG. 1, a movable table 2 is set on a base 1. The movable table 2 is provided on the top face of a horizontal moving unit 3 placed on the base 1. A board stage 4 and a thermo-compression tool stocker 5 are juxtaposed on the movable table 2. A board 80 is held on the board stage 4, which is an example of the board holding unit.

A plurality of types of thermo-compression tools corresponding to size or other forms of electronic components, which are the mounting objects, are stocked on the stocker 5. The stocked thermo-compression tools are selectively set on the thermo-compression head 20. In this case, as an example, two thermo-compression tools 101 which have conventionally been in use are juxtaposed on the stocker 5, and the thermo-compression tool 50 according to the present invention is included in the thermo-compression head 20.

As the movable table 2 is moved horizontally by drive of the horizontal moving unit 3, the board stage 4 and the stocker 5 are moved horizontally in an X direction or Y direction. As a result, the board stage 4 and the stocker 5 are positioned with respect to the thermo-compression head 20. That is, in this embodiment, the horizontal moving unit 3 is an example of the positioning device.

A board carry-in unit 10 and a board carry-out unit 11 for carrying in and out the board 80 for the board stage 4 are provided on both sides of the board stage 4. The board carry-in unit 10 has a carry-in arm 10a for carrying the board 80 to the board stage 4. Also, the board carry-out unit 11 has a carry-out arm 11a for carrying the board 80 downstream. It is noted that, herein, a direction in which the board 80 is carried is assumed as an X direction while a direction perpendicular to that direction within a horizontal plane is assumed as a Y direction.

The thermo-compression head 20 is located above the board stage 4. The thermo-compression head 20 is fitted at a lower portion of the up/down unit 21 attached to a frame 22 on the base 1. The thermo-compression head 20 is moved up and down by drive of the up/down unit 21 and is equipped, by suction to its bottom face, with the thermo-compression tool fitted on the stocker 5 positioned below. Also, the thermo-compression head 20 is moved down with respect to the board stage 4 positioned below, and thermo-compresses an electronic component P, which has been sucked up and held by the thermo-compression tool, to the board 80 on the board stage 4.

In the electronic component mounting apparatus 90 of FIG. 1, a component feed unit 30 is placed beside the thermo-compression head 20. The component feed unit 30 includes a tray placement table 32 for placing thereon a tray 31 in which a plurality of electronic components P are housed with their bump formation surface up, and a tray positioning table 33 for moving the tray placement table 32 in the Y direction.

An electronic component conveyance unit 34 for picking up an electronic component P from the tray 31 and conveying the component to the thermo-compression head 20 is placed above the component feed unit 30. The electronic component conveyance unit 34 includes a conveyance head moving table 36 for reciprocatively moving the conveyance head 35 along the X-axis direction in the figure from above the tray 31 of the component feed unit 30 to a proximity of the thermo-compression head 20, where the conveyance head moving table 36 is fitted on the front face of the frame 22.

The conveyance head 35 includes a suck-up member 38 attached via an arm 37, and a nozzle 38a set on the suck-up member 38. The suck-up member 38 is rotatably fitted to the tip end of the arm 37, and the nozzle 38a can be changed in posture, upward and downward, by rotation of the suck-up member 38.

The conveyance head 35 includes a up/down unit for moving up and down the arm 37, serving for moving down the downward-postured nozzle 38a relative to the tray 31 to pick up the electronic component P. Thereafter, the suck-up member 38 is rotated to make the nozzle 38a changed into the upward posture, and the conveyance head 35 is moved to a proximity of the thermo-compression head 20 by operation of the conveyance head moving table 36, by which the electronic component P, which is held by the upward-facing nozzle 38a with the bump formation surface facing downward, is transferred to just under the thermo-compression head 20. In this state, the thermo-compression head 20 is moved down, and the electronic component P is sucked up and held to the thermo-compression tool 50 fitted to the bottom face of the thermo-compression head 20.

Referring to FIG. 1, an observation unit (or image pickup unit) 40 is placed below the thermo-compression head 20. The observation unit 40 is fitted to a moving unit 41 provided on the frame 22, and can be moved horizontally in the X direction or Y direction by drive of the moving unit 41. The observation unit 40 is moved to between the board 80 and the electronic component P before their alignment, serving for capturing an image of the board 80 and the electronic component P. In thermo-compression of the electronic component P and the board 80, the observation unit 40 withdraws toward the frame 22 so as not to obstruct the move-down operation of the thermo-compression head 20.

Figure 2:
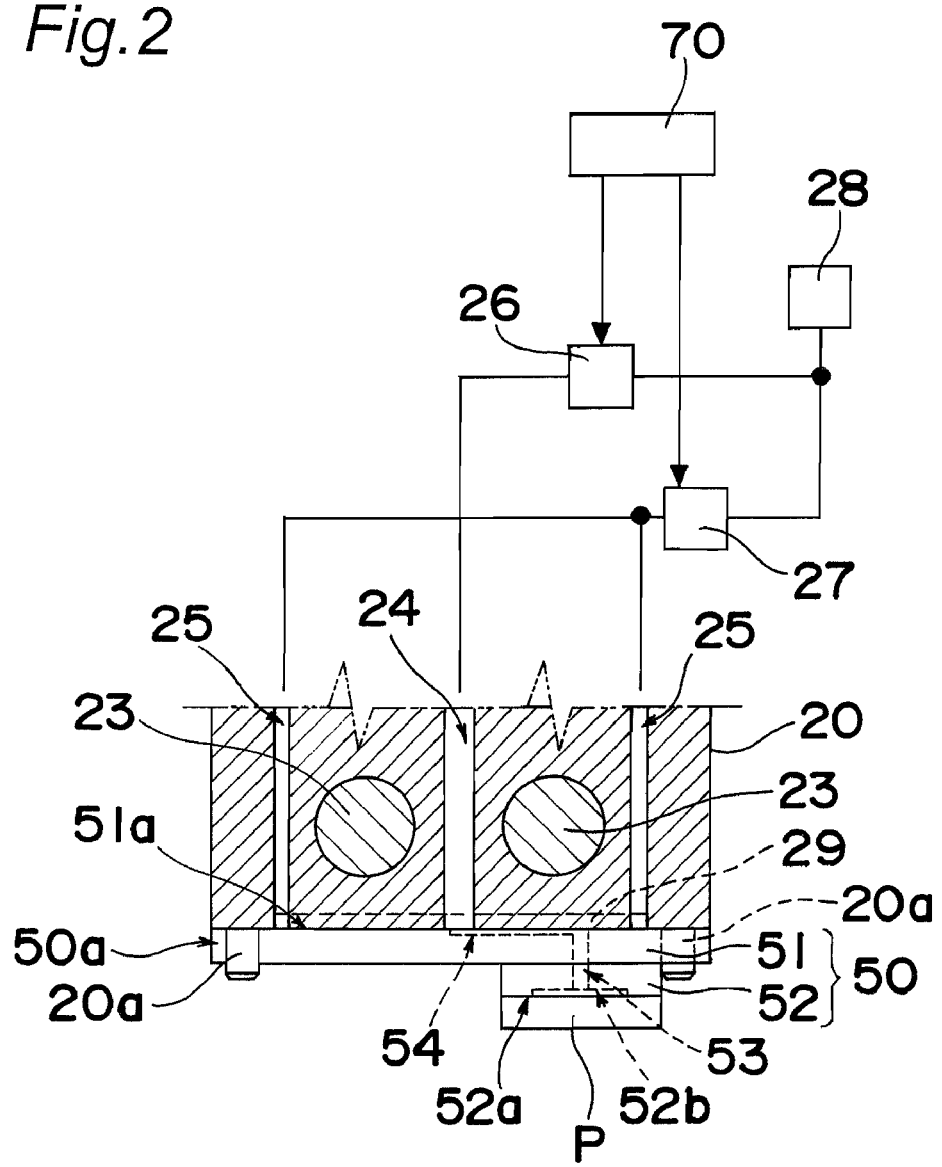
FIG. 2 is a schematic side view of a thermo-compression head included in the electronic component mounting apparatus of the embodiment.
Figure 3:
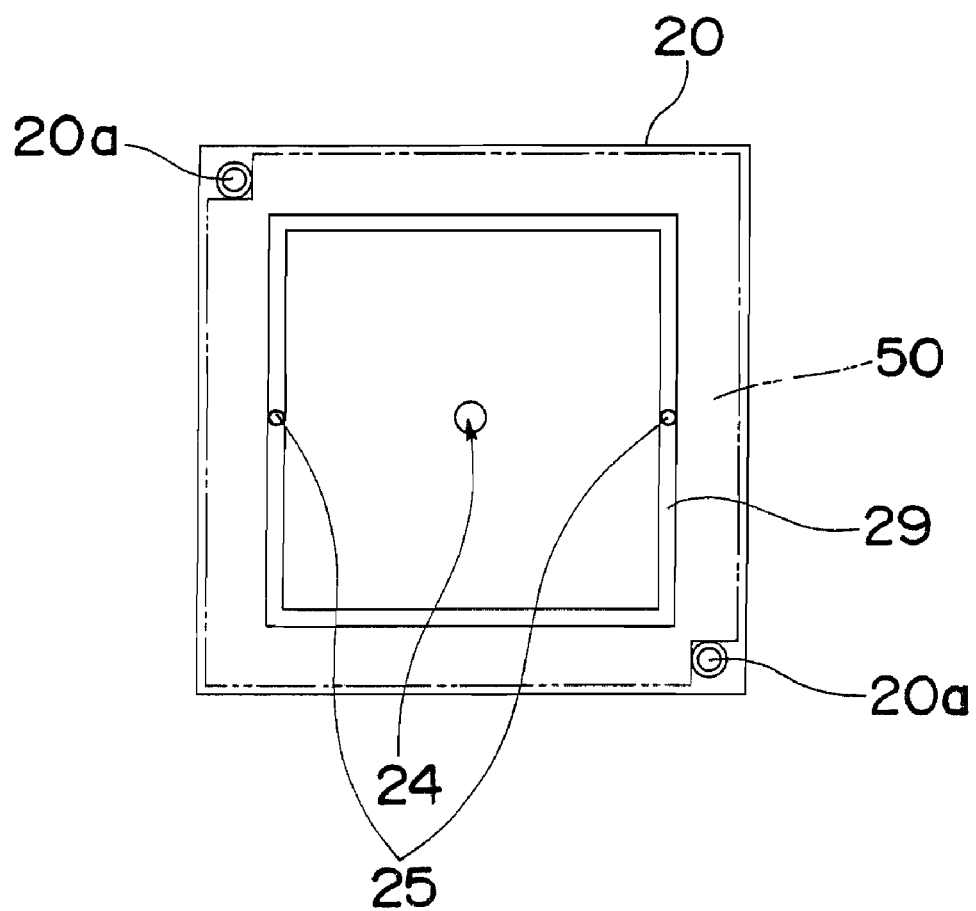
FIG. 3 is a schematic bottom view of a thermo-compression head of the electronic component mounting apparatus of the embodiment.

Next, the structure of the thermo-compression head 20 is explained with reference to FIGS. 2 and 3. FIG. 2 shows a side face (including a partial cross section) in a state that the thermo-compression tool 50 is sucked up and fitted to the bottom face of the thermo-compression head 20. FIG. 3 shows the bottom face of the thermo-compression head 20. Referring to FIGS. 2 and 3, a heater 23 such as a ceramic heater is provided as a heating unit at a lower portion of the thermo-compression head 20. A first suction hole 24 as an example of the head-side suction hole, is formed at a center of the thermo-compression head 20, and second suction holes 25 are formed on both sides of the first suction hole 24, respectively, so as to be open in the bottom face of the thermo-compression head 20.

In FIG. 2, the first suction hole 24 and the second suction holes 25 communicate with a suction pump 28, which serves as suction device, via a first valve 26 and a second valve 27, respectively. The first valve 26 and the second valve 27 are opened and closed according to a control command by a control unit 70, thus enabled to selectively change over the communication between the first and second suction holes 24, 25 and the suction pump 28.

As shown in FIG. 3, the bottom face of the thermo-compression head 20 is formed in a rectangular shape, and a suction groove 29 having a rectangular frame shape in a plan view is further formed in the bottom face. The second suction holes 25 opens inside the suction groove 29. Also, a pair of positioning pins 20a is protrusively provided at diagonal corner portions of the bottom face, more specifically left upper corner portion and right lower corner portion as viewed in FIG. 3.

Figure 4A:
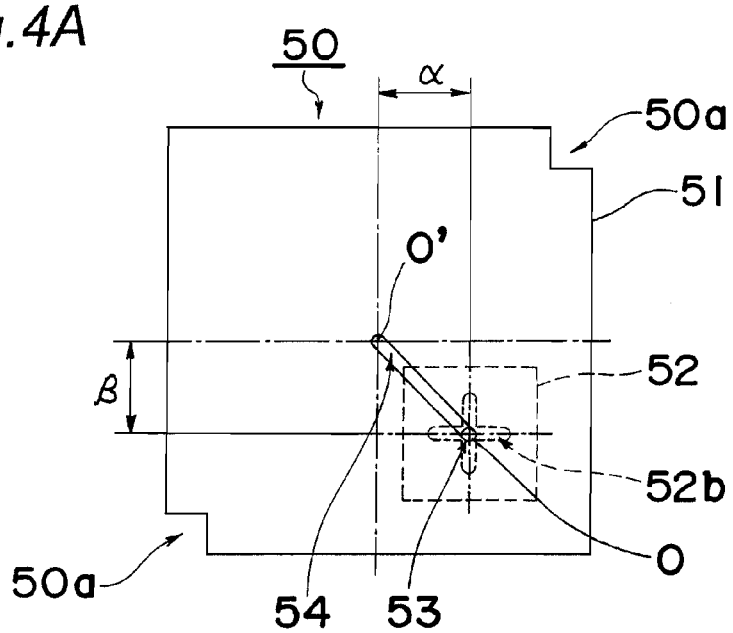
FIG. 4A is a schematic plan view of a thermo-compression tool of the embodiment.
Figure 4B:
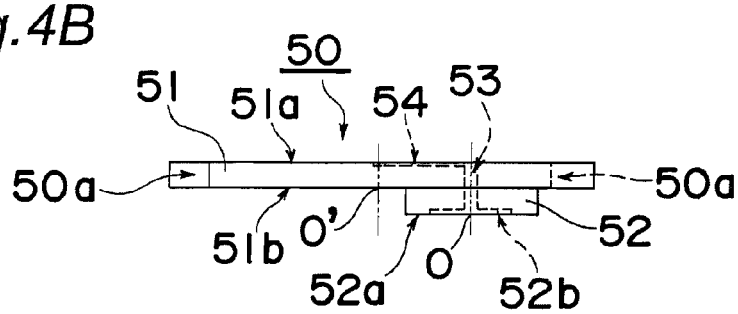
FIG. 4B is a schematic side view of the thermo-compression tool of the embodiment.
Figure 4C:
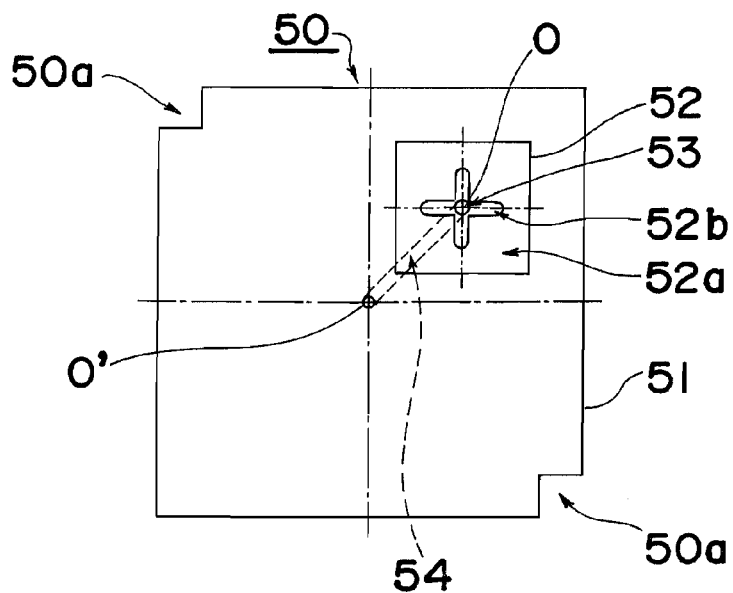
FIG. 4C is a schematic bottom view of the thermo-compression tool of the embodiment.

Next, the thermo-compression tool 50 is explained with reference to FIGS. 4A, 4B and 4C in addition to FIGS. 2 and 3. FIG. 4A is a schematic plan view, FIG. 4B is a schematic side view, and FIG. 4C is a schematic bottom view of the thermo-compression tool 50. The thermo-compression tool 50 includes a base member 51 formed as a generally rectangular-shaped thin plate member, and a suck-up member 52 protrusively provided at a proximity of a corner portion in a lower surface 51b of the base member 51. The suck-up member 52 has a form corresponding to size or other forms of the electronic component that is the mounting object. Meanwhile, the base member 51 has a form corresponding to the form of the bottom face of the thermo-compression head 20. The description of this embodiment is based on a case where, as shown in FIGS. 4A, 4B and 4C, the suck-up member 52 having a size small enough relative to the base member 51 is included in the thermo-compression tool 50.

Referring to FIG. 4A, the suck-up member 52 is formed in the lower surface of the base member 51 so that a center (planar center) O of the suck-up member 52 is located at a position which is decentered rightward by 'α' and downward by 'β', as in the figure, from a center (planar center) O' of the base member 51. A pair of cutout portions 50a is formed at one-diagonal corner portions of the base member 51. When the thermo-compression tool 50 is fitted to the bottom face of the thermo-compression head 20, the positioning pins 20a, which are protrusively provided on the bottom face of the thermo-compression head 20, and the cutout portions 50a are engaged with each other, respectively, as shown in FIGS. 2 and 3. As a result, an alignment between the thermo-compression head 20 and the thermo-compression tool 50 by their center positions can be achieved.

Referring to FIG. 4B, in the thermo-compression tool 50, a suck-up hole 53 is formed at a center O of a suck-up face (lower surface in the figure) 52a of the suck-up member 52 and in the fitting surface (upper surface in the figure) of the base member 51 so as to open and extend therethrough. Also, a communicating groove 54 is formed in the fitting surface (upper surface in the figure) 51a of the base member 51 so as to make the center O' of the fitting surface 51a and the suck-up hole 53 communicated with each other (see also FIG. 4A). Referring to FIG. 4C, a cross groove 52b having a cross shape in a plan view is formed in the suck-up face 52a of the suck-up member 52, and the suck-up hole 53 is opened at a center of the cross groove 52b, i.e., a crossing portion of the cross shape.

As shown in FIG. 2, in the state that the fitting surface (upper surface) 51a of the thermo-compression tool 50 is kept in contact with the bottom face of the thermo-compression head 20, as the suction pump 28 is driven and the second valve 27 is opened, the interior of the suction groove 29 communicating with the second suction holes 25 is reduced in pressure so that the fitting surface 51a of the base member 51 is sucked up and held to the bottom face of the thermo-compression head 20. As a result, the thermo-compression tool 50 can be fitted on the thermo-compression head 20. Also, when the second valve 27 is closed, the suction state of the thermo-compression tool 50 is released, thus allowing the thermo-compression tool 50 to be separated from the thermo-compression head 20.

The thermo-compression head 20 shown in FIG. 2 is in the state that the thermo-compression tool 50 is fitted thereon. The communicating groove 54 formed in the fitting surface 51a of the base member 51 comes to have a suction passage portion formed therein by the fitting surface 51a being brought into contact with the bottom face of the thermo-compression head 20, where the first suction hole 24 of the thermo-compression head 20 and the suck-up hole 53 of the suck-up member 52 are communicated with each other through the suction passage portion. As the first valve 26 is opened in the communicated state as shown above, the interior of the cross groove 52b of the suck-up member 52 is reduced in pressure, make it possible to suck and hold the electronic component P kept in contact with the suck-up face 52a.

Referring to FIG. 2, as the heater 23 is increased in temperature with the electronic component P sucked and held to the suck-up face 52a, heat is transferred from the fitting surface 51a of the thermo-compression tool 50 to the thermo-compression tool 50, so that the thermo-compression tool 50 as a whole increases in temperature. As a result, heat transfer to the electronic component P sucked and held to the suck-up face 52a can be achieved.

Next, the observation unit 40, which is an example of the image pickup unit, is explained with reference to the schematic structural view shown in FIG. 5. In a fore end portion of a lens barrel portion 41, i.e. a vicinity of an end portion on the near side in the drawing sheet, a prism 42 which is in one unit of two pieces is located near a center of the end portion, and a first reflecting portion 43a and a second reflecting portion 43b are located on both sides of the prism 42. In the rear of the first reflecting portion 43a and the second reflecting portion 43b as viewed in the figure, a first camera 44a and a second camera 44b are provided, respectively. In the lens barrel portion 41, a first opening portion 41a and a second opening portion 41b are opened vertically with the prism 42 interposed therebetween.

Figure 5:
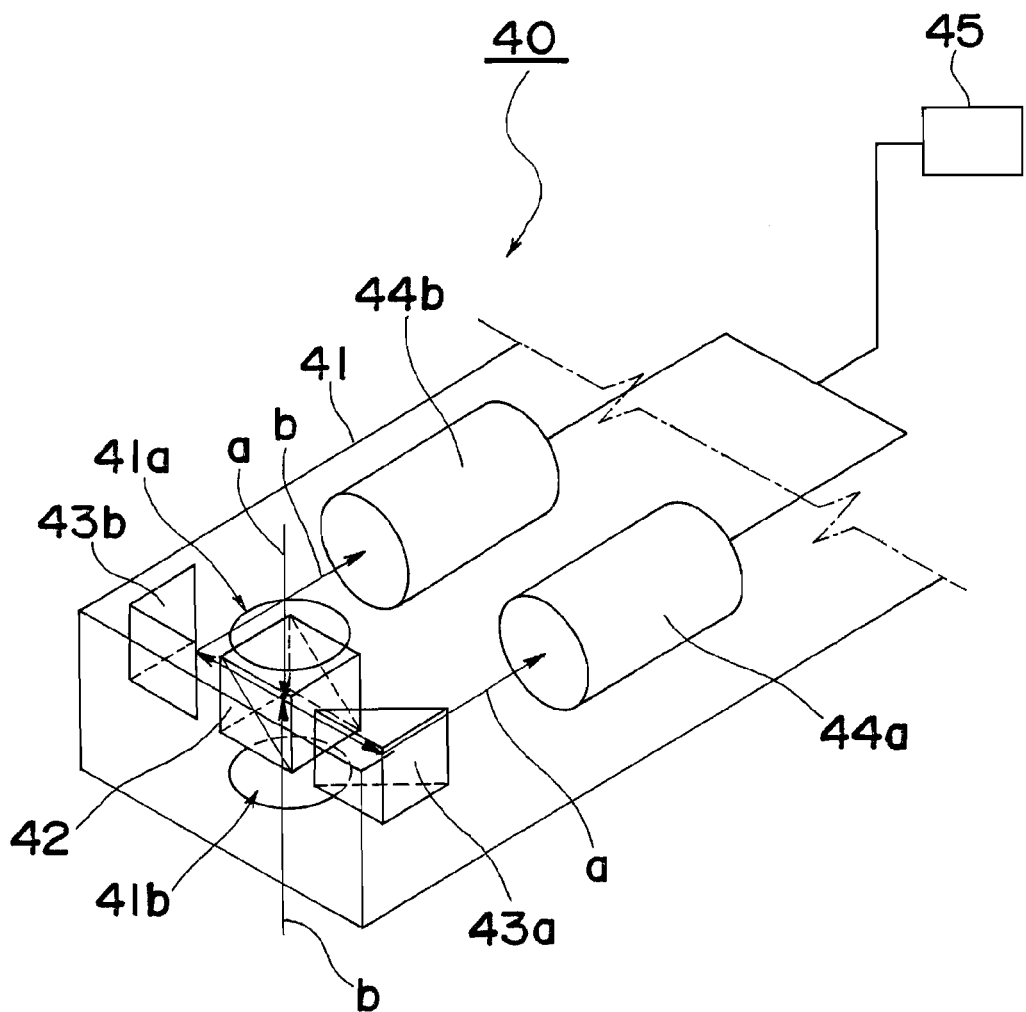
FIG. 5 is a schematic perspective view of an observation unit included in the electronic component mounting apparatus of the embodiment.

Referring to FIG. 5, a ray 'a' of light incident through the first opening portion 41a from above as viewed in the figure is reflected by the prism 42 and the first reflecting portion 43a, going incident on the first camera 44a. Also, a ray 'b' of light incident through the second opening portion 41b from below as viewed in the figure is reflected by the prism 42 and the second reflecting portion 43b, going incident on the second camera 44b. The first camera 44a and the second camera 44b are electrically connected to an image recognition section 45, and the rays 'a', 'b' incident on the first camera 44a and the second camera 44b are captured as an image and processed in the image recognition section 45.

Figure 6:
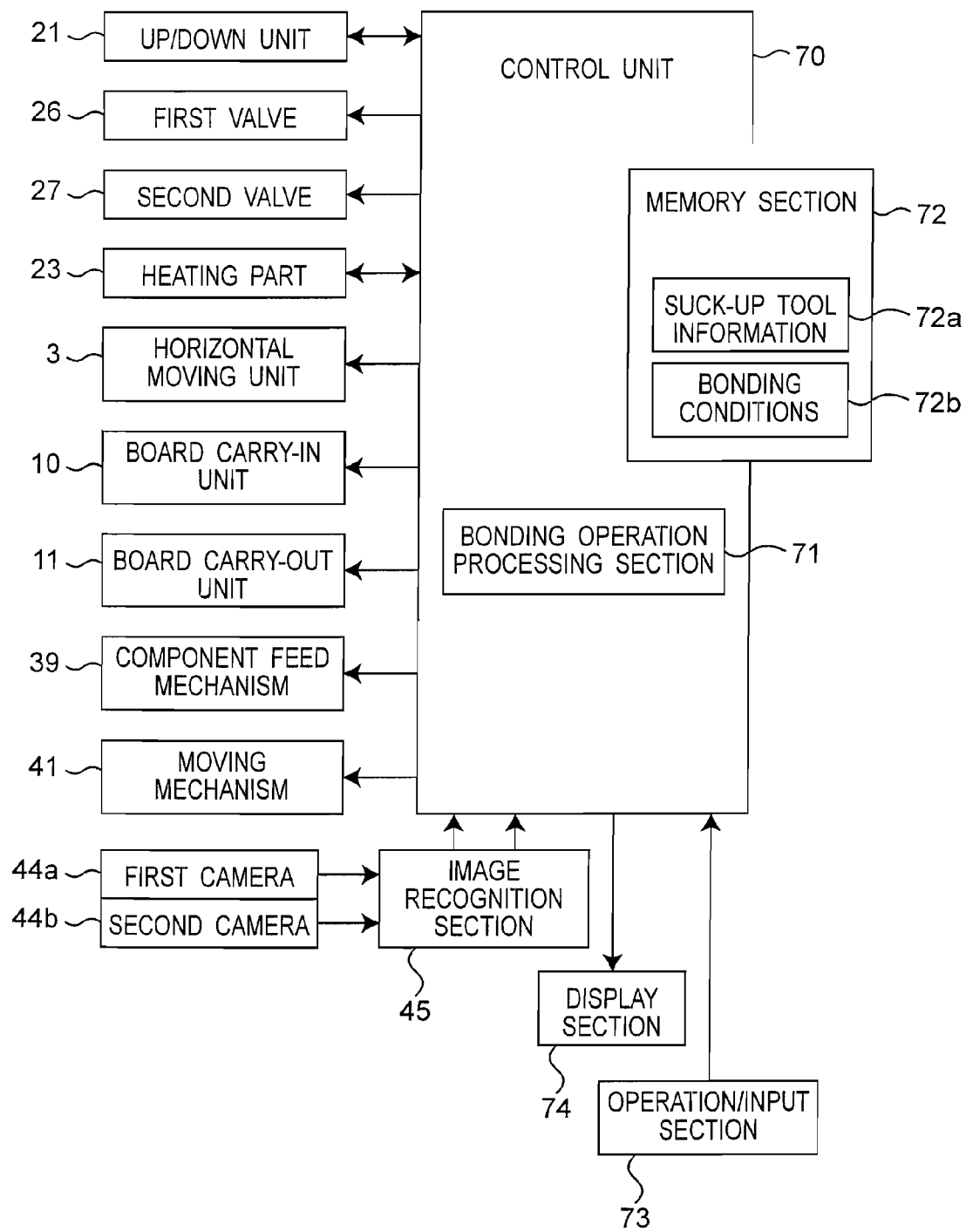
FIG. 6 is a block diagram showing a construction of a control system of the electronic component mounting apparatus in the embodiment.

Next, a control system of the electronic component mounting apparatus is explained with reference to FIG. 6. The control unit 70 contains a bonding operation processing section (mounting operation processing section) 71 and a memory section 72, serving for operation control over the electronic component mounting apparatus. The up/down unit 21, upon receiving an operation command from the bonding operation processing section 71, make the thermo-compression head 20 moved up and down. Positional (height) information as to the thermo-compression head 20 is fed back and managed by the bonding operation processing section 71. The first valve 26 and the second valve 27, upon receiving an operation command from the bonding operation processing section 71, performs the opening and closing operation of the valves. As a result, placement of the thermo-compression tool 50 onto the thermo-compression head 20 and the suction and holding of electronic component P to the thermo-compression tool 50 are carried out. The heating unit (heater) 23 rises to a specified temperature by a command from the operation processing section 71 to heat the thermo-compression tool 50 set on the thermo-compression head 20.

The horizontal moving unit 3, upon receiving an operation command from the bonding operation processing section 71, positions the board 80 and the thermo-compression tool 50 held by the board stage 4 and the stocker 5, respectively, on the movable table 2. Horizontal positional information as to the board 80 and the thermo-compression tool 50 is fed back and managed by the bonding operation processing section 71.

The board carry-in unit 10 and the board carry-out unit 11, upon receiving an operation command from the bonding operation processing section 71, performs carry-in and carry-out, respectively, of the board 80 for the board stage 4. A component feed mechanism 39, upon receiving an operation command from the bonding operation processing section 71, picks up an electronic component P stored in the tray 31 and delivers it to the thermo-compression tool 50 set on the thermo-compression head 20.

Figure 8:
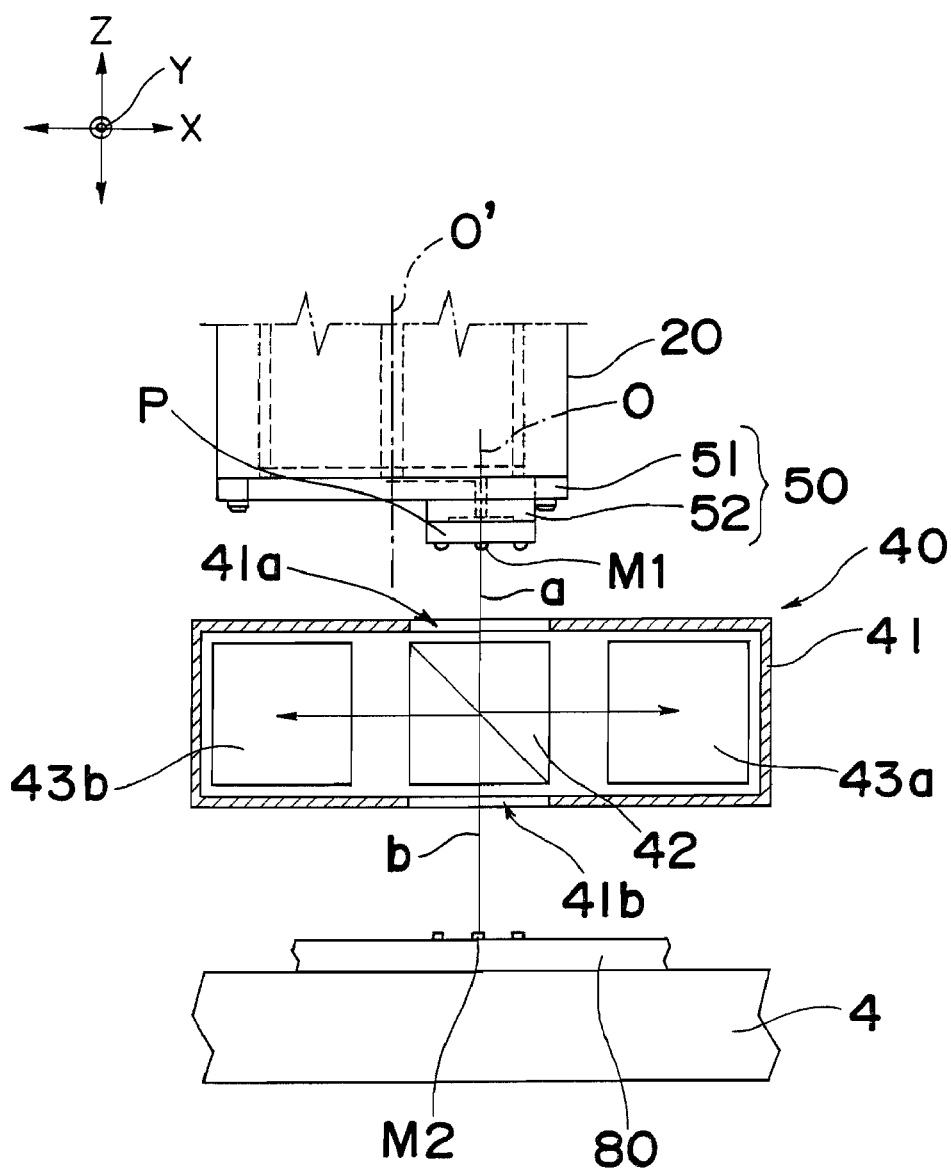
FIG. 8 is a schematic side view showing a positional relationship among an electronic component sucked up by the thermo-compression head, the observation unit and the board in the embodiment.

The moving unit 41 for the observation unit, upon receiving an operation command from the bonding operation processing section 71, positions the observation unit 40. The first camera 44a and the second camera 44b provided in the observation unit 40, upon receiving an operation command from the bonding operation processing section 71, picks up an image of a recognition part M1 provided on the electronic component P and a recognition part M2 provided on the board 80 (see FIG. 8), thus capturing an image. The captured image is processed in the image recognition section 45, by which any misalignment between the electronic component P and the board 80 is recognized. Based on the recognition result by the image recognition section 45, an alignment amount for alignment between the electronic component P and the board 80 is calculated in the bonding operation processing section 71. The board stage 4 is moved horizontally according to the alignment amount, by which the alignment between the board 80 and the electronic component P is achieved. It is noted that the recognition parts M1, M2 only have to be objects that can be recognized by a picked-up image and, for example, an identification mark part or an electrode or the like may be adopted as those objects.

The memory section 72 has stored thermo-compression tool information 72a and thermo-compression conditions 72b and the like. The thermo-compression tool information 72a contains data such as sizes of the thermo-compression tools 50 and displacement amounts α and β of the suck-up member 52 in the thermo-compression tool 50. The thermo-compression conditions 72b contain data such as various types of control parameter values, heating temperatures for thermo-compression, compression time, and compression weight, or the like. These data are inputted from an operation/input section 73 such as a keyboard or a disk drive unit. Also, a data input guide, an operating status of the electronic component mounting device 90 and the like are displayed on a display section 74 such as a liquid crystal panel or a CRT.

Figure 7:
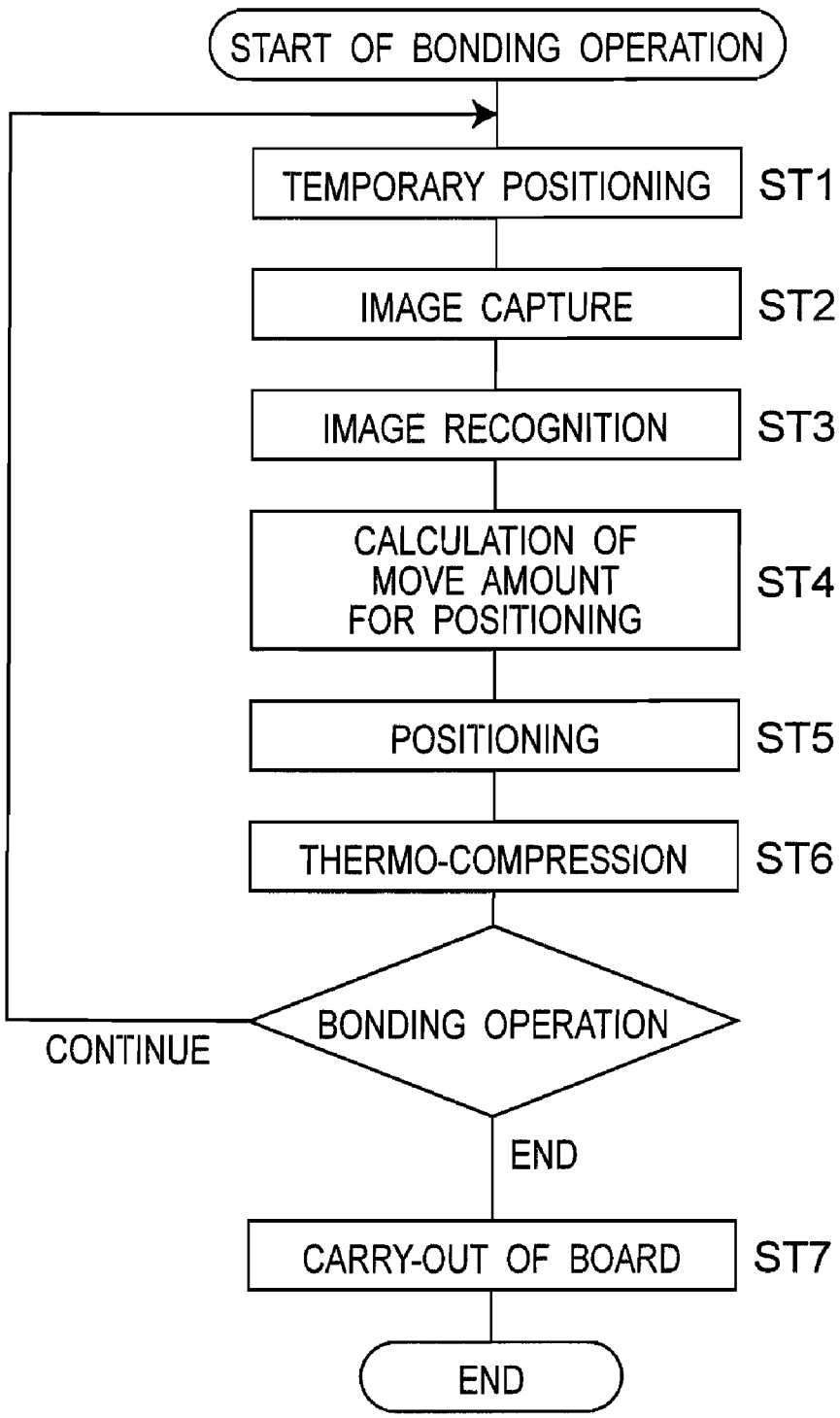
FIG. 7 is a flowchart showing the procedure of bonding operation (mounting operation) by the electronic component mounting apparatus of the embodiment.

The electronic component mounting device 90 is constructed as described above. Next, bonding operation by the electronic component mounting apparatus is explained with reference to the flowchart shown in FIG. 7. First, the board 80 held on the board stage 4 is temporarily positioned (ST1). In the schematic explanatory view shown in FIG. 8, the center O of the suck-up member 52 is decentered by 'α' in the X direction and by 'β' in the Y direction from the center O' of the thermo-compression tool 50 (see FIG. 4A). Therefore, for the temporary positioning of the board 80, the board 80 is moved from vertically below the center of the thermo-compression tool 50 to a position defined by shift amounts of 'α' in the X direction and 'β' in the Y direction.

Next, the observation unit 40 is moved to between the temporarily positioned board 80 and the electronic component P there has been picked up by the thermo-compression tool 50, and an image of the recognition part M1 of the electronic component P and the recognition part M2 of the board 80 is picked up and captured by the first camera 44a and the second camera 44b (ST2). The captured image is recognized in the image recognition section 45 (ST3).

Next, an Alignment Amount Necessary for the alignment between the board 80 and the electronic component P is calculated based on the image recognition result (ST4). The board stage 4 is moved according to the alignment amount, by which the alignment between the board 80 and the electronic component P is achieved (ST5) Upon completion of the alignment, the electronic component P is heated while being pressed against the board 80, by which the thermo-compression of the electronic component P and the board 80 is achieved (ST6).

Figure 9:
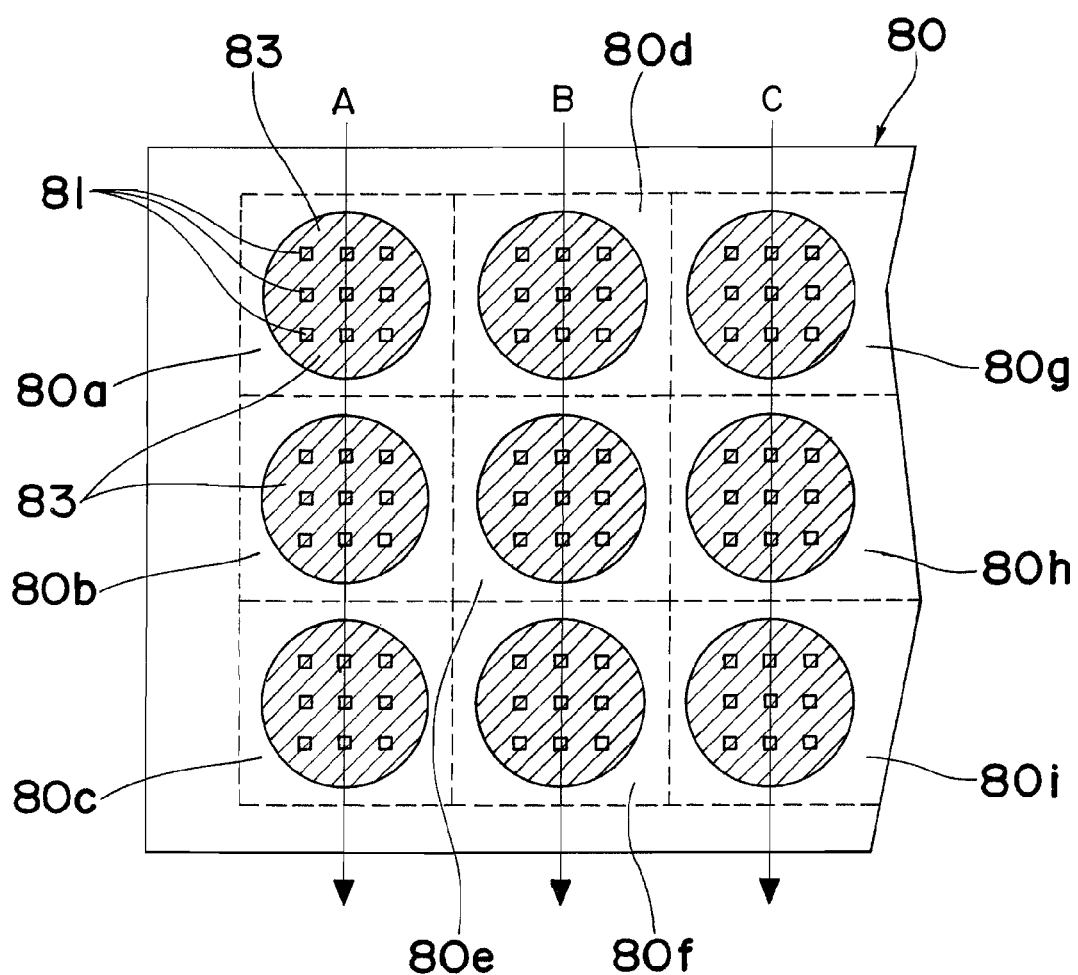
FIG. 9 is a schematic plan view of the multi-piece board in the embodiment.
Figure 10A:
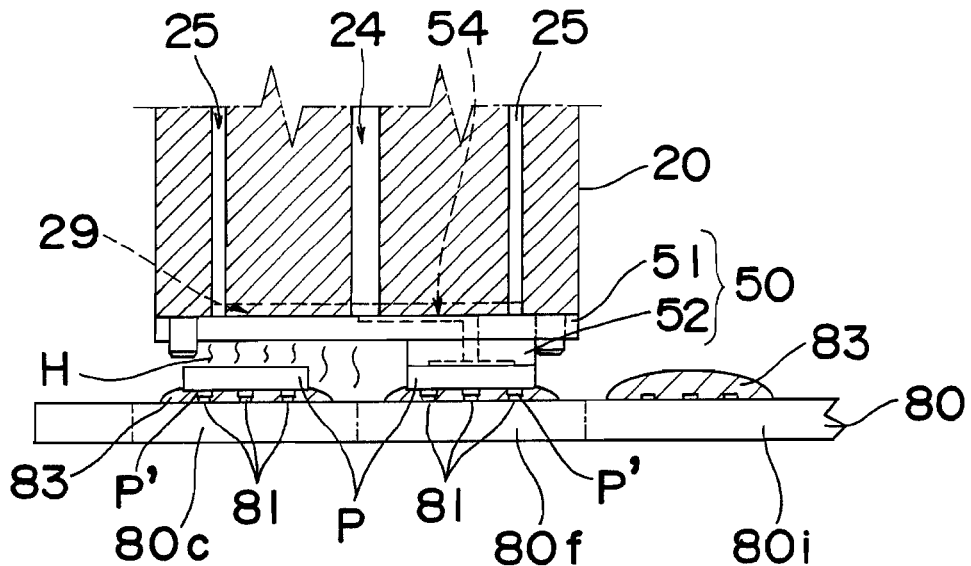
FIG. 10A is a schematic side view showing a state in which electronic components are mounted onto the multi-piece board by the thermo-compression tool in the embodiment.

Next, a method for thermo-compressing the electronic component P to the board 80 is explained with reference to the schematic plan view of the board 80 shown in FIG. 9, the schematic side view of FIG. 10A showing a state in which electronic components P are being compressed to the board 80, and the schematic plan view of the state of compression shown in FIG. 10B. As shown in FIG. 9, the board 80 is a multi-piece board, in which a plurality of unit boards are segmented. Therefore, the operations of ST1 to ST6 described above are performed in succession, by which the electronic components P are thermo-compressed to all the unit boards. More specifically, as shown in FIG. 9, the board 80 is a set of a plurality of unit boards that are segmented into unit boards 80a, 80b, 80c, . . . 80h and 80i. The unit boards 80a, 80b, 80c, . . . are formed in such a manner that, for example, those have generally identical shape and size and are segmented in a grid-like shape as shown by broken line in the figure. Also, in each unit board 80a or the like, a plurality of electrodes 81 to be electrically connected to the electronic component P are connected, and a thermosetting bonding material 83 is further fed and placed so as to cover the top faces of the electrodes 81.

The thermo-compression of the electronic components P and the unit boards 80a, 80b, 80c . . . is performed sequentially, starting from 80a, along arrows A, B and C shown in FIG. 9. The operations of ST1 to ST6 are successively repeated for the individual unit boards 80a, 80b, 80c . . . , and the electronic components P are thermo-compressed to the unit boards 80a, 80b, 80c, 80d, 80e, 80f, 80g, 80h and 80i one by one. When the electronic components P are thermo-compressed to all the unit boards 80a, 80b, 80c . . . , the bonding operation ends and the board 80 is carried out from on the board stage 4 to the next step (ST7).

Figure 10B:
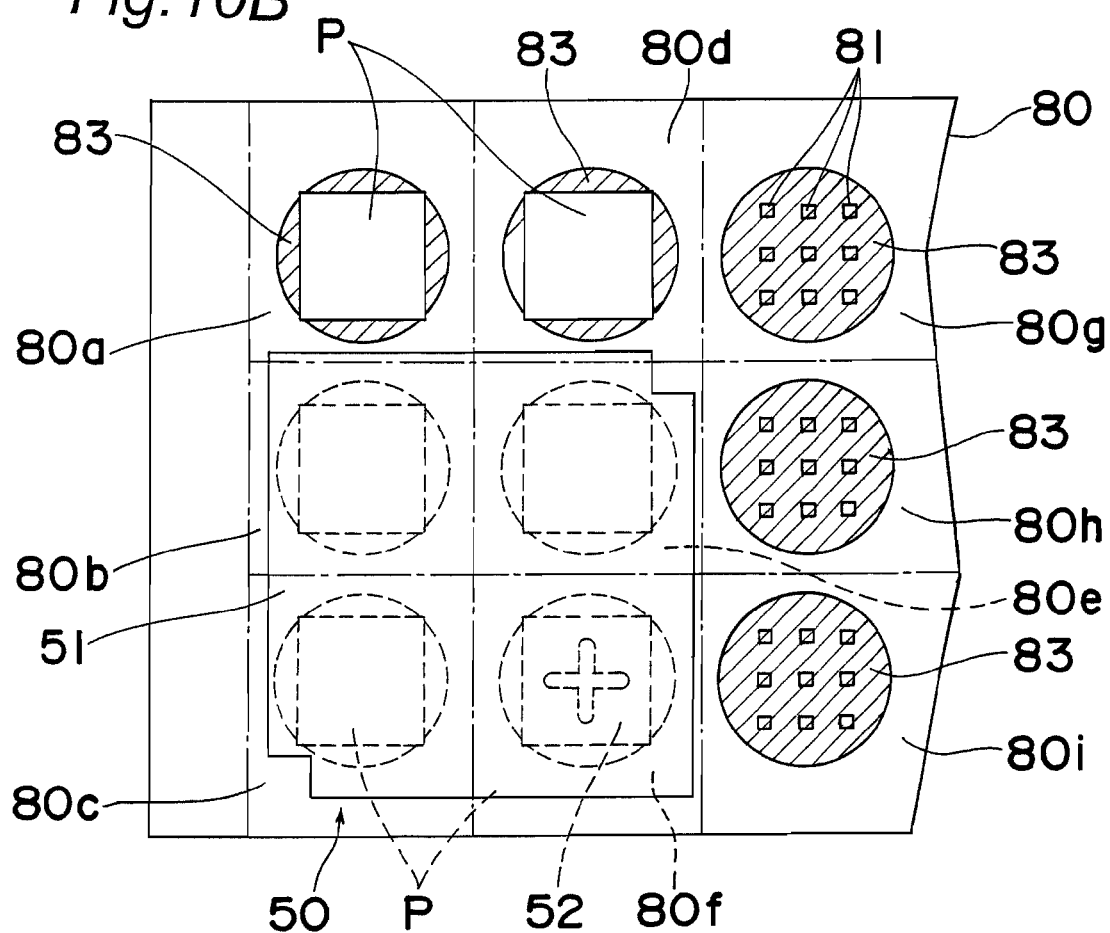
FIG. 10B is a schematic plan view showing a state in which electronic components are mounted onto the multi-piece board by the thermo-compression tool in the embodiment.
Figure 11A:
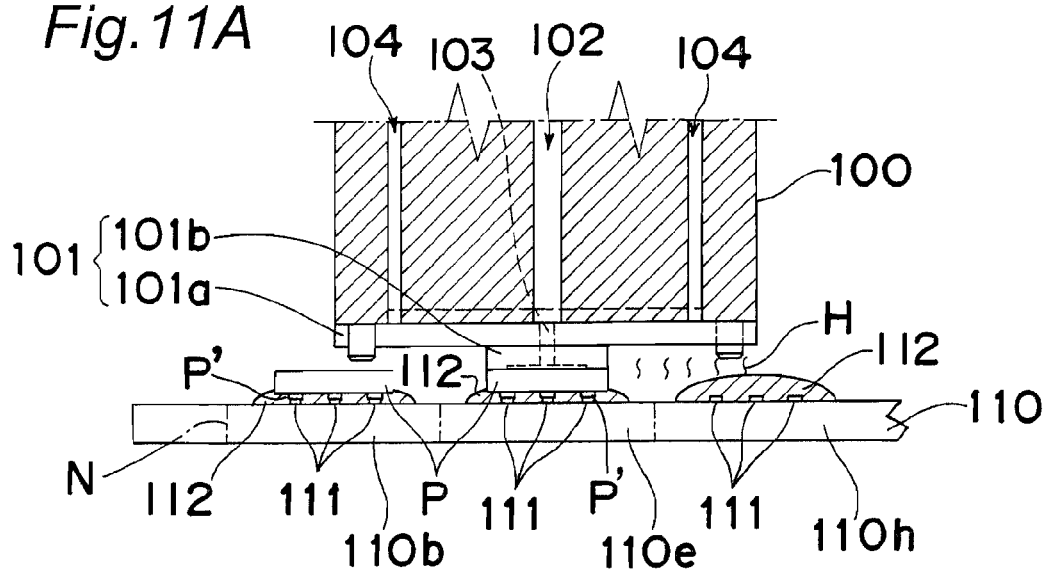
FIG. 11A is a schematic side view showing a state in which electronic components are mounted onto a multi-piece board by a conventional thermo-compression tool.
Figure 11B:
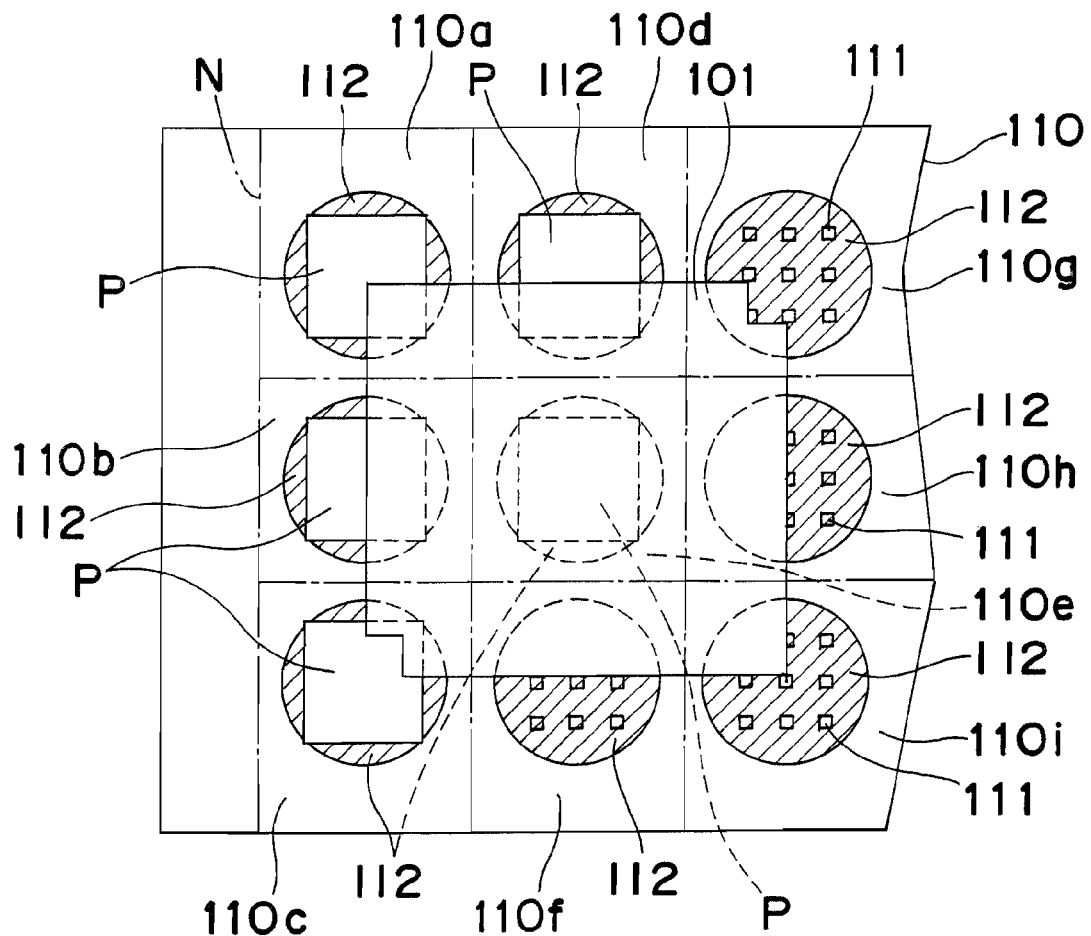
FIG. 11B is a schematic plan view showing a state in which electronic components are mounted onto the multi-piece board by the conventional thermo-compression tool.

FIGS. 10A and 10B show a state in which the electronic components P are thermo-compressed to the unit board 80f. Referring to FIG. 10B, electronic components P have already been mounted on the unit boards 80a to 80e, and not yet mounted on the unit boards 80g to 80i and so on.

In the thermo-compression tool 50 fitted on the thermo-compression head 20 is, as shown in FIG. 10B, the suck-up member 52 is protrusively provided at a position decentered to a right lower corner portion, as viewed from the thermo-compression head 20 side. Therefore, even when the thermo-compression head 20 is moved down for the thermo-compression of the electronic component P, which has been sucked up to the suck-up member 52, onto the unit board 80f, it does not occur that the base member 51 of the thermo-compression tool 50 may come close to above the unit boards 80g, 80h, 80i on which the electronic components P have not yet been mounted, but the base member 51 comes close only to the unit boards 80b, 80c and 80e, on which the electronic components P have already been mounted. Although the schematic views of FIGS. 10A and 10B illustrate the circumstances under which the electronic component P is thermo-compressed to the unit board 80e by the thermo-compression tool 50, yet circumstances are similar also with the thermo-compression to any of the unit boards 80a, 80b, 80c . . . . By performing the thermo-compression sequentially to the unit boards 80a, 80b, 80c . . . along the arrows A, B and C shown in FIG. 9, it never occurs that the base member 51 may come close to above any unit board before mounting, and it necessarily occurs that the unit board to which the base member 51 comes close is one on which the electronic component P has already been mounted.

For instance, with respect to the multi-piece board 80 shown in FIG. 9, in the case where the mounting of the electronic component P by thermo-compression is carried out sequentially with the first unit board 80a, the second unit board 80b and the third unit board 80c, which are adjacently arrayed in one line, the positioning of the suck-up member 52 and the first unit board 80a is first performed in the state that the base member 51 is not positioned above the second and third unit boards 80b, 80c among those unit boards 80a to 80c but positioned above the first unit board 80a, and thereafter, the electronic component P is mounted onto the first unit board 80a. Subsequently, in the state that the base member 51 is not positioned above the third unit board 80c but positioned above the first and second unit boards 80a, 80b, the positioning of the suck-up member 52 and the second unit board 80b is performed and thereafter the electronic component P is mounted onto the second unit board 80b. Finally, the positioning of the third unit board 80c and the suck-up member 52 is performed, followed by the mounting of the electronic component P. By taking the steps shown above, the base member 51 can at all times be kept from being positioned above any unit board on which the electronic component P has not yet been mounted.

Accordingly, radiant heat H radiated from the lower surface of the heated thermo-compression tool 50 has no thermal influence on the thermosetting bonding material 83 placed on those unit boards on which no electronic component P has been mounted. As a result of this, it becomes implementable to prevent occurrence of any thermal adverse influences, for example, that the radiant heat H is imparted to the thermosetting bonding material 83 before the thermo-compression of the electronic component P so that the thermosetting bonding material 83 progresses goes on its hardening and deteriorates. Thus, occurrence of troubles, for example, that the thermosetting bonding material 83 cannot exert a desired bonding power in the mounting operation can be prevented in advance.

Although the base member 51 of the thermo-compression tool 50 comes close to above the unit boards 80b, 80c and 80e, which are adjacent to the board 80f, so that the radiant heat H has an influence thereon, yet the unit boards 80b, 80c and 80e, each of which has the electronic component P mounted thereon with the thermosetting bonding material 83 thermally hardened, are kept from such adverse influences as described above. On the contrary, the impartment of the radiant heat H to the thermosetting bonding material 83 that has already had the electronic component P mounted thereon and thermally hardened as described above contributes to further hardening of the thermosetting bonding material 83. Further, taking advantage of such an effect makes it practicable to execute a mounting method in which with a cutting of the time required for the thermo-compression process of the electronic component P with the thermosetting bonding material 83 by the thermo-compression tool 50, a further hardening process for the thermosetting bonding material 83 is performed with the use of the radiant heat H applied from the lower surface of the base member 51 subsequent to the thermo-compression process. With such a mounting method, the time required for the mounting can be shortened so that a more efficient mounting can be fulfilled.

As described above, the thermo-compression tool 50, which is formed with the suck-up member 52 displaced, is set on the thermo-compression head 20, and the mounting is carried out in a specified order with a plurality of unit boards 80a, 80b, 80c . . . segmented in the board 80. As a result of this, the thermosetting bonding material on unit boards on which the electronic component P has not yet been mounted can be prevented from receiving thermal influences due to radiant heat, so that such thermal adverse influences as deterioration of the thermosetting bonding material due to the radiant heat from the thermo-compression tool can be eliminated.

Figure 12:
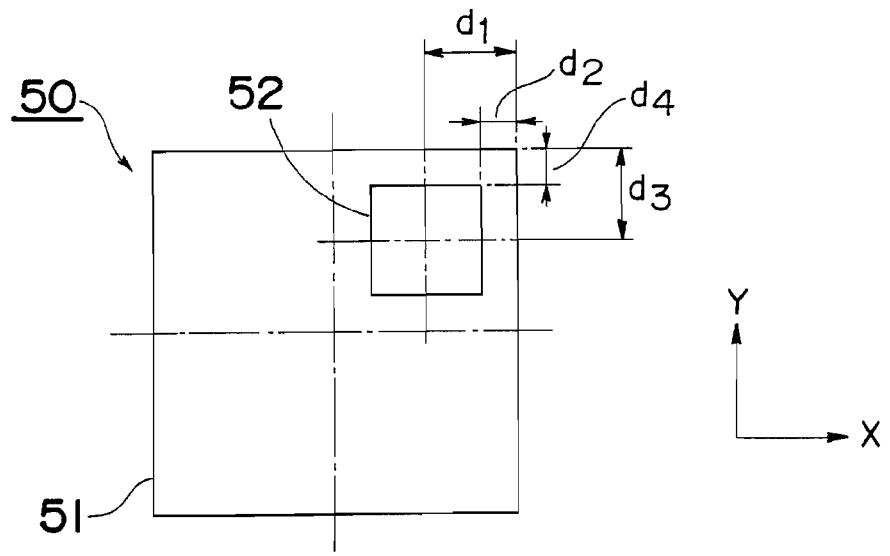
FIG. 12 is a schematic lower face view of the thermo-compression tool in the embodiment.
Figure 13:
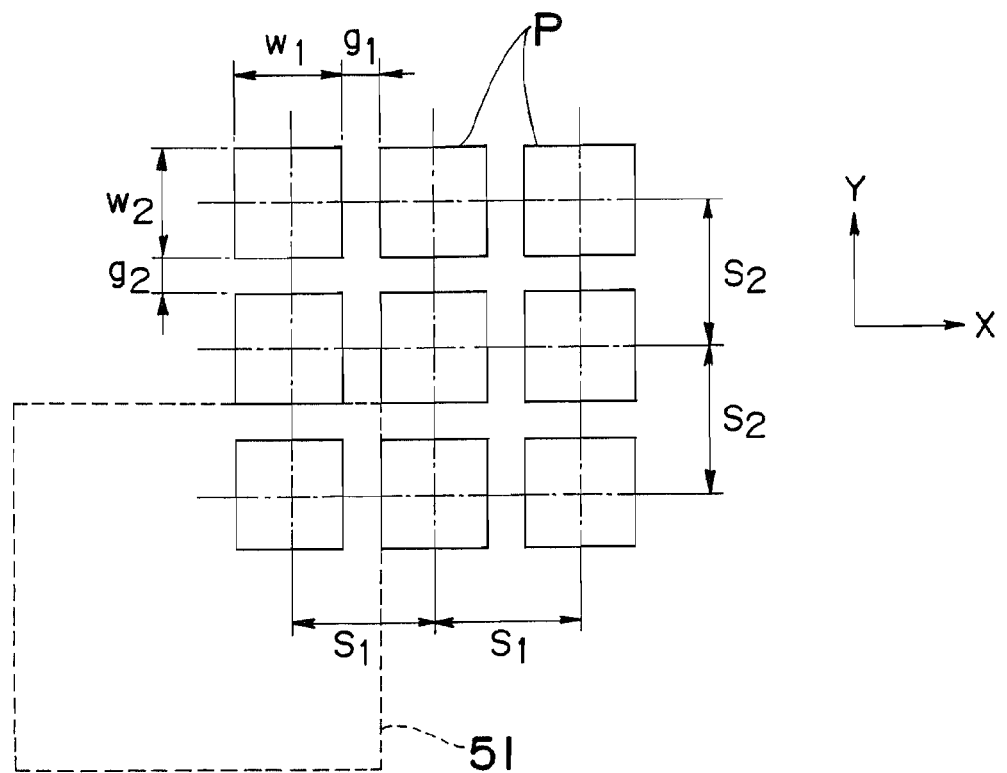
FIG. 13 is a schematic explanatory view showing mounting placement of the individual electronic components in the board.

Here is given an explanation as to the placement relationship between the base member 51 and the suck-up member 52 in the thermo-compression tool 50. In connection with this explanation, FIG. 12 shows a schematic lower face view of the thermo-compression tool 50 of this embodiment, and FIG. 13 shows a schematic plan view showing placement of the individual electronic components P to be mounted onto the board 80. It is noted that since the schematic lower face view of FIG. 12 is a drawing primarily intended to explain the placement relationship between the base member 51 and the suck-up member 52, the other detailed component members are not shown. Similarly, since the schematic plan view of FIG. 13 is a drawing primarily intended to explain the placement of the electronic components P, the unit boards and the like are omitted in illustration.

As shown in FIG. 12, in the thermo-compression tool 50, the placement of the suck-up member 52 is so determined that the center of the generally square-shaped suck-up member 52 is displaced from the center of the generally square-shaped base member 51. For the suck-up member 52, for example, its displacement position is determined in such a fashion that a distance between its one center along the X-axis direction and one proximate end portion of the base member 51 becomes $d_1$, a distance between its one center along the Y-axis direction and one proximate end portion of the base member 51 becomes $d_3$, a distance between one end portion of the suck-up member 52 and the end portion of the base member 51 along the X-axis direction becomes $d_2$, and further a distance between an end portion of the suck-up member 52 and the end portion of the base member 51 in the Y-axis direction becomes $d_4$.

Next described is a method for determining such a displacement position. As an example, here is discussed a case where a plurality of electronic components P are mounted onto the board 80, as shown in FIG. 13, so as to be arrayed in a matrix form with an interval pitch $s_1$ in the X-axis direction and an interval pitch $s_2$ in the Y-axis direction. It is assumed that each of the electronic components P is so sized as to have a width $w_1$ in the X-axis direction, a width $w_2$ in the Y-axis direction, a gap size $g_1$ between adjoining electronic components P in the X-axis direction, and a gap size $g_2$ between adjoining electronic components P in the Y-axis direction. Then, with reference to FIG. 13, when the thermo-compression is performed on, for example, an electronic component P located at the left lower corner in the figure by the thermo-compression tool 50 (indicated by broken line in the figure), it is necessary, in order that each of an electronic component P adjoining rightward in the X-axis direction and an electronic component P upward adjoining in the Y-axis direction, as viewed in the figure, be not positioned at least just under the base member 51, that a distance $d_1$ between the center of the suck-up member 52 along the X-axis direction and the proximate end portion of the base member 51 and a distance $d_3$ between the center of the suck-up member 52 along the Y-axis direction and the proximate end portion of the base member 51 be set so as to satisfy conditions of Equations (1) and (2) from geometric relationships:

$$d_1 \leq w_1 \times \tfrac{1}{2} + g_1 \quad (1)$$

$$d_3 \leq w_2 \times \tfrac{1}{2} + g_2 \quad (2)$$

Also, under the condition that such distances $d_1$ and $d_3$ as satisfy Equations (1) and (2) are set and in order that a specified size of the suck-up member 52 is placed, it can be considered that the distance $d_2$ between the end portion of the suck-up member 52 and the end portion of the base member 51 in the X-axis direction and the distance $d_4$ between the end portion of the suck-up member 52 and the end portion of the base member 51 in the Y-axis direction are desirably set at as small values as possible, e.g., at 0 (zero). However, in consideration of uniformity in heat distribution on the surface of the base member 51, setting the distances $d_2$ and $d_4$ to 0 (zero) could make it impossible to achieve heat transfer to the suck-up member 52 with a uniform heat distribution due to influences of heat radiation from the side faces of the base member 51 or the like. Thus, such distances $d_2$ and $d_4$ are preferably determined from the viewpoint of forming a uniform heat distribution in consideration of thermal characteristics (material, configuration, etc.) of the base member 51 to be used.

In the case of the thermo-compression tool of this embodiment, the base member 51 is formed with a 35 mm×35 mm size, the suck-up member 52 is formed with a 1 mm to 20 mm size according to the size of the electronic component P to be mounted, and the distances $d_2$ and $d_4$ are determined so as to be not less than 1 mm for the formation of a uniform heat distribution. In addition, in this case, the base member 51 is 1 mm thick and the suck-up member 52 is 1 mm thick.

The above embodiment has been described on a case where, in the electronic component mounting apparatus 90, the thermo-compression tool 50 of the embodiment is fitted on the thermo-compression head 20 while conventional thermo-compression tools 101 are placed in the stocker 5. However, the present invention is not limited to only such a case. Instead, the case may be that, for example, a thermo-compression tool on which a suck-up member different in size from the suck-up member 52 of the thermo-compression tool 50 is placed so as to be displaced from the center is provided as the thermo-compression tool of the present invention in the stocker 5.

Also, the description has been made on a case where, in the thermo-compression tool 50, the base member 51 and the suck-up member 52 are formed in generally rectangular shapes. However, various other forms may also be adopted as those for the base member and the suck-up member. As the form of the base member, it is preferable to adopt a common form that accords to the configuration of the bottom face of the thermo-compression head 20, while the form of the suck-up member is preferably determined in accordance with the configuration of the electronic component P that is the target of the thermo-compression process.

It is to be noted that, by properly combining the arbitrary embodiments of the aforementioned various embodiments, the effects possessed by them can be produced.

According to the thermo-compression tool and the electronic component mounting apparatus and mounting method of the present invention, an electronic component suck-up member is protrusively provided at a location displaced from the center of the thermo-compression tool so that in successive mounting of electronic components by thermo-compression onto a plurality of unit boards segmented in the multi-piece board, the thermo-compression tool is kept from approaching above the thermosetting bonding material placed on the before-mounting unit boards, so that occurrence of any thermal adverse influences of radiant heat of the thermo-compression tool on the thermosetting bonding material can be avoided. Thus, the present invention is useful in fields involving the mounting of electronic components such as flip chips which is done by sucking up the electronic component with a thermo-compression tool and mounting it onto a multi-piece board.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2005-178788 filed on Jun. 20, 2005 including specification, drawing and claims are incorporated herein by reference in its entirety.

The invention claimed is:

1. An electronic component mounting method for mounting an electronic component onto each unit board in a multi-piece board, which is segmented into a plurality of unit boards, by thermo-compressing the electronic component via a previously fed and placed thermosetting bonding material while sucking up and holding the electronic component, the method comprising:

placing thermosetting bonding material on each unit board, the plurality of unit boards including a first unit board, a second unit board, and a third unit board which are mutually adjacently arranged in a line;

after said placing operation, sucking up and holding the electronic component to a suck-up member of a thermo-compression tool, wherein the thermo-compression tool includes a base member which is removably fitted on a head-bottom face of a thermo-compression head in an electronic component mounting apparatus and in which heating by heat transfer for thermo-compression is performed through the head-bottom face of the thermo-compression head, and wherein the suck-up member has a suck-up surface which is formed so as to be smaller than a lower surface of the base member in correspondence to a size of the electronic component and by which the electronic component is sucked up and held, the suck-up member being fixed on the lower surface of the base member at a position displaced from a center of the lower surface;

positioning the sucked-up-and-held electronic component and the first unit board such that the base member is not positioned above the second and third unit boards but positioned above the first unit board;

after said positioning operation, moving down the thermo-compression tool and then thermo-compressing the electronic component via the thermosetting bonding material, by which the electronic component is mounted onto the first unit board;

sucking up and holding another electronic component to the suck-up member of the thermo-compression tool; and after said sucking up and holding another electronic component operation, positioning the electronic component and the second unit board so that the base member is not positioned above the third unit board but positioned above the first and second unit boards.

2. The electronic component mounting method as defined in claim 1, wherein the mounting of the electronic component onto each of the unit boards is performed by the thermo-compression tool, in which the base member is a generally rectangular-shaped plate member and the suck-up member is fixed at a position near a corner portion in the lower surface of the base member.

* * * * *